(12) United States Patent
Li et al.

(10) Patent No.: US 8,325,950 B2
(45) Date of Patent: Dec. 4, 2012

(54) SILICON CONDENSER MICROPHONE

(75) Inventors: Hai-Feng Li, Shenzhen (CN); Rui Zhang, Shenzhen (CN)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 210 days.

(21) Appl. No.: 12/855,544

(22) Filed: Aug. 12, 2010

(65) Prior Publication Data

US 2011/0216922 A1    Sep. 8, 2011

(30) Foreign Application Priority Data

Mar. 8, 2010   (CN) .......................... 2010 1 0119951

(51) Int. Cl.
*H04R 25/00*   (2006.01)

(52) U.S. Cl. ...... 381/174; 381/191; 29/25.41; 29/25.35; 29/592.1; 29/594

(58) Field of Classification Search .................. 381/174, 381/191; 29/25.35, 25.41, 592.1, 594
See application file for complete search history.

(56) References Cited

U.S. PATENT DOCUMENTS
2007/0201710 A1*   8/2007   Suzuki et al. ................ 381/174
* cited by examiner

*Primary Examiner* — Curtis Kuntz
*Assistant Examiner* — Amir Etesam
(74) *Attorney, Agent, or Firm* — IPro, Inc.; Na Xu

(57) ABSTRACT

Disclosed is a silicon condenser microphone including a backplate having a plurality of perforations therethrough, a diaphragm opposed from the backplate for forming a capacitor. The diaphragm includes a first part and a second part received in the first part, the second part being capable of vibrating relative to the backplate. The first part is connected to the ground and the second part is connected to a bias voltage.

7 Claims, 1 Drawing Sheet

SILICON CONDENSER MICROPHONE

BACKGROUND OF THE INVENTION

1. Field of the Invention

The present invention generally relates to miniature microphones used in electronic devices, more particularly to a silicon condenser microphone for converting sound waves to electrical signals.

2. Description of Related Art

A typical condenser microphone generally includes a diaphragm/backplate pair forming a capacitor which varies with sound pressure, and a Field Effect Transistor (FET) circuit for buffering the output signal. Miniature microphones used in electronic devices are typically electret condenser microphones. These are built with highly precision stamped metal parts, organic diaphragm films such as mylar and polyester, and highly charged electret films to bias the microphones. These microphones have certain short-comings. The size has been reduced to the limits of manufacturability. Lack of uniformity in the stamping and assembly processes results in a large variability in sensitivity. Furthermore, temperature and humidity effects on the organic diaphragm film and electret result in long term drift in microphone performance.

In attempts to overcome the difficulties associated with traditional miniature microphones, various workers have tried to make solid state microphones using semi-conductor techniques. The silicon based condenser microphone also known as an acoustic transducer has been in a research and development stage for more than 20 years. Because of its potential advantages in miniaturization, performance, reliability, environmental endurance, low cost, and mass production capability, the silicon microphone is widely recognized as the next generation product to replace the conventional electret condenser microphone that has been widely used in communication, multimedia, consumer electronics, hearing aids, and so on. Of all the silicon based approaches, the capacitive condenser type of microphone has advanced the most significantly in recent years.

The silicon condenser microphone is typically comprised of two basic elements which are a sensing element and a pre-amplifier IC device. The sensing element is basically a variable capacitor constructed with a movable compliant diaphragm, a rigid and fixed perforated backplate, and a dielectric spacer to form an air gap between the diaphragm and backplate. When the diaphragm vibrates, capacitance of the capacitor varies, by which sound waves are converted to electric signals. However, the diaphragm is generally the type of one-piece and the periphery thereof is fixed to the silicon base. When the diaphragm vibrates, a parasitic capacitor will occur between the diaphragm and the silicon base.

SUMMARY OF THE INVENTION

In one embodiment of the invention, a silicon condenser microphone includes a silicon base, a backplate located above the base and defines a plurality of perforations, and a diaphragm opposed from the backplate. The diaphragm includes an inner vibrating part and an outer part surrounding the inner part. A gap is formed between the inner vibrating part and the outer part. The inner vibrating part is provided with a first electrode pad electrically connected to a bias voltage, and the outer part is provided with a second electrode pad connected to the ground.

Other features of the present invention will become more apparent to those skilled in the art upon examination of the following drawings and detailed description of exemplary embodiment.

DETAILED DESCRIPTION OF THE PREFERRED EMBODIMENT

Reference will now be made to describe the exemplary embodiment of the present invention in detail.

An exemplary embodiment of the present invention provides a silicon condenser microphone used in a mobile phone for converting sound waves into electrical signals.

Figure 1:
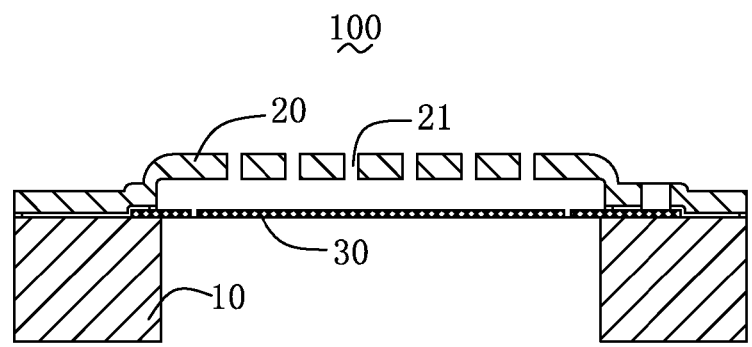
FIG. 1 is an illustration of a silicon condenser microphone in accordance with an exemplary embodiment of the present invention.
Figure 2:
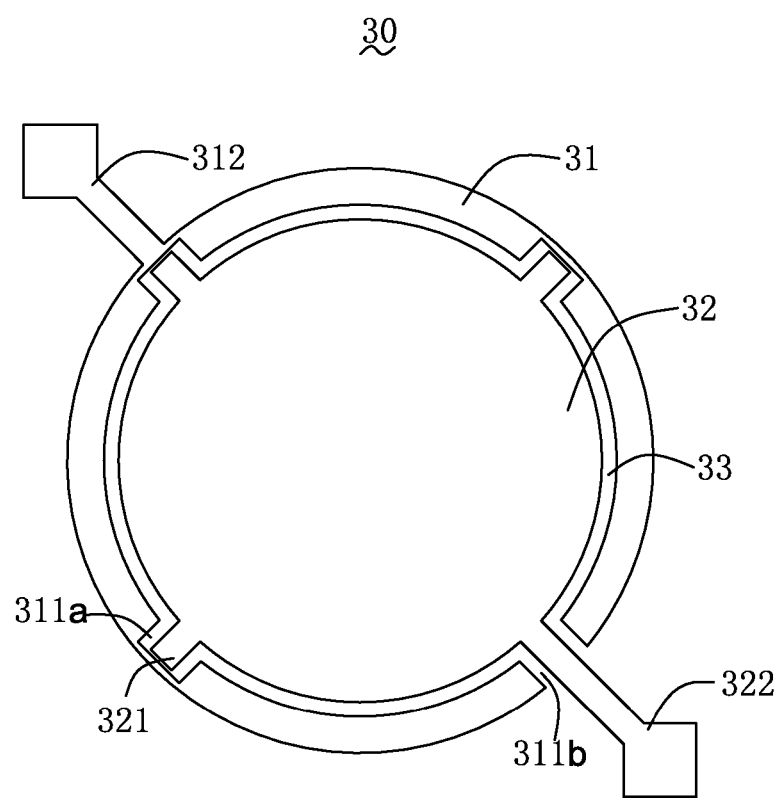
FIG. 2 is an illustration of a diaphragm of the silicon condenser microphone in FIG. 1.

Referring to FIG. 1, a silicon condenser microphone 100 of the exemplary embodiment includes a base 10, a diaphragm 30 anchored to the base 10, and a backplate 20 opposed to the diaphragm 30. The backplate 20 defines a plurality of perforations 21. The diaphragm 30 and the backplate 20 is respectively provided with an electrode (not shown) for forming a capacitor. While the diaphragm 30 is activated to vibrate by the sound pressure of the sound waves, a distance between the diaphragm 30 and the backplate 20 is changed and the capacitance value of the capacitor is accordingly changed, which converts the sound waves into electrical signals.

The capacitance value of the capacitor can be calculated by the following formula:

$$C = \frac{k\varepsilon_0\varepsilon_r S}{d},$$

wherein k, $\epsilon_0$ and $\epsilon_r$ are all constants. Therefore, the capacitance value is determined by the distance and the facing area between the diaphragm and the backplate.

The diaphragm 30 of the silicon condenser microphone 100 includes an inner vibrating part 32 and an outer part 31 surrounding the inner part 32. A gap 33 is provided between the inner part 32 and the outer part 31 for reducing the parasitic capacitance. The inner vibrating part 32 of the diaphragm 30 defines a first electrode pad 322 extending from a periphery thereof toward the outer part 31 and electrically connected to the base, and the outer part 31 defines a second electrode pad 312 electrically connected to the base. Preferably, the second electrode pad 312 extends along a direction opposite to the direction along which the first electrode pad 322 extends. The outer part 31 defines a plurality of recesses 311a, and the inner vibrating part 32 correspondingly defines a plurality of supporting arms 321 partially accommodated in the recesses 311a. The outer part 31 further defines a channel 311b. The first electrode pad 322 extends from the periphery of the inner vibrating part 32 toward the outer part 31 and arrives at the base through the channel 311b. In fact, the first electrode pad 322 is electrically connected to a bias voltage, and the second electrode pad is connected to ground.

As the outer part 31 is earthed, the parasitic capacitance value is reduced, and the sensitivity of the microphone is improved.

In summary, the present invention provides a silicon condenser microphone including a diaphragm and a backplate for forming a capacitor. The diaphragm includes a first part having a space for receiving a second part, and a gap between the first part and the second part. While activated, the second part vibrates relative to the backplate, and accordingly, the capacitance value is changed. For reducing parasitic capacitance value, the first part is connected to the ground and the second part is electrically connected to the bias voltage.

While the present invention has been described with reference to the specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A silicon condenser microphone, comprising: a silicon base; a back plate located above the base and a plurality of perforations; a diaphragm opposed from the back plate, the diaphragm comprising an inner vibrating part and an outer part surrounding the inner part; a capacitor formed by the back plate and the diaphragm; a gap formed between the inner vibrating part and the outer part; wherein the inner vibrating part is provided with a first electrode pad electrically connected to a bias voltage, and the outer part is provided with a second electrode pad connected to the ground; and wherein the outer part of the diaphragm, while continuously connected, defines a plurality of recesses, and the inner vibrating part correspondingly defines a plurality of supporting arms partially accommodated in the recesses.

2. The silicon condenser microphone as described in claim 1, wherein the outer part of the diaphragm further defines a channel and the first electrode pad extends through the channel.

3. The silicon condenser microphone as described in claim 1, wherein the first electrode pad extends along a direction opposite to a direction along which the second electrode pad extends.

4. A silicon condenser microphone, comprising: a back plate having a plurality of perforations there through; a diaphragm opposed from the back plate for forming a capacitor, the diaphragm including a first part and a second part received in the first part, the second part being capable of vibrating relative to the back plate; a gap formed between the first part and the second part; wherein the first part is connected to the ground and the second part is connected to a bias voltage; and wherein the first part of the diaphragm, while continuously connected, defines a plurality of recesses and the second part defines a plurality of supporting arms partially received in the recesses.

5. The silicon condenser microphone as described in claim 4, wherein the first part defines an electrode pad extending along a first direction, and the second part defines another electrode pad extending along a second direction, the first direction being opposite to the second direction.

6. The silicon condenser microphone as described in claim 5, wherein the first part of the diaphragm defines a plurality of recesses, and the second correspondingly defines a plurality of supporting arms partially received in the recesses.

7. The silicon condenser microphone as described in claim 6, wherein the first part of the diaphragm further defines a channel and the electrode pad of the second part extends through the channel.

* * * * *